United States Patent [19]
Furber

[11] Patent Number: 5,918,042
[45] Date of Patent: Jun. 29, 1999

[54] DYNAMIC LOGIC PIPELINE CONTROL

[75] Inventor: Stephen Byram Furber, Winslow, United Kingdom

[73] Assignee: Arm Limited, Cambridge, United Kingdom

[21] Appl. No.: 08/783,310

[22] Filed: Jan. 10, 1997

[30] Foreign Application Priority Data

Feb. 29, 1996 [GB] United Kingdom .................... 9604367

[51] Int. Cl.⁶ .................................................. G06F 13/00
[52] U.S. Cl. ...................................... 395/559; 364/716.04
[58] Field of Search ....................... 711/169; 364/716.04; 395/551, 553, 559

[56] References Cited

U.S. PATENT DOCUMENTS

| | | | |
|---|---|---|---|
| 4,949,249 | 8/1990 | Lefsky | 395/559 |
| 4,958,274 | 9/1990 | Dutton | 395/559 |
| 5,280,597 | 1/1994 | Takata et al. | 711/169 |
| 5,471,607 | 11/1995 | Garde | 395/559 |

*Primary Examiner*—Eric Coleman
*Attorney, Agent, or Firm*—Nixon & Vanderhye P.C.

[57] ABSTRACT

A multi-stage pipeline comprising a plurality of pipeline stages 2 is described. Each pipeline stage 2 incorporates a dynamic logic circuit 4, a latch circuit 6, and a pipeline stage control circuit 8. The dynamic logic circuit 4 is controlled by the pipeline stage control circuit 8 to begin its evaluation of the input data signals supplied to it when the pipeline stage control circuit 8 receives:

(i) a signal indicating said plurality of input data signals are available; and (ii) a signal indicating said plurality of output data signals currently latched within said latch circuit are being read by a downstream circuit that will complete said reading in time for said plurality of output data signals being evaluated by said dynamic logic circuit to be latched by said latch circuit before said before plurality of output data signals become invalid due to inherent charge leakage within said dynamic logic circuit.

11 Claims, 9 Drawing Sheets

DYNAMIC LOGIC PIPELINE CONTROL

BACKGROUND OF THE INVENTION

1. Field of the Invention

This invention relates to data processing systems. More particularly, this invention relates to data processing systems that incorporate pipelines using dynamic logic.

2. Description of the Prior Art

Self-timed pipeline circuits employing a two-phase bundled data protocol were proposed by I. E. Sutherland in "Micropipelines", Communications of the ACM, Vol. 32, Number 6 June 1989, pp 720–738. The AMULET1 processor developed at the University of Manchester between 1991 and 1994 used a similar micropipeline design style. The AMULET1 processor is described in: S. B. Furber, P. Day, J. D. Garside, N. C. Paver, and J. V. Woods, "A Micropipelined ARM", Proceedings of the IFIP TC 10/WG 10.5 International Conference on Very Large Scale Integration (VLSI '93), Grenoble, France, September 1993. Ed. Yanagawa, T. and Ivey, P. A. Pub. North Holland; S. B. Furber, P. Day, J. D. Garside, N. C. Paver, and J. V. Woods, "AMULET1: A Micropipelined ARM", Proceedings of the IEEE Computer Conference, March 1994; and N. C. Paver, "The Design and Implementation of an Asynchronous Microprocessor", PhD Thesis, University of Manchester, June 1994. The AMULET1 processor also used two-phase control.

The AMULET1 processor employs dynamic logic techniques in some parts of its datapaths. However, since the delay-insensitive control circuit within such processors can stall in any state, extra circuitry is included (such as additional latches or charge retention circuitry) to give the dynamic circuits pseudo-static behavior. Dynamic circuits are considered desirable because they allow a particularly small and power efficient processor to be produced. However, these advantages are to some extent negated if additional circuitry needs to be provided to yield pseudo-static behavior.

Dynamic logic may be used without such additional circuitry providing certain conditions are met. Inherent charge leakage within dynamic logic circuits causes the output of the circuit to be valid for a short period of time. Accordingly, it has been proposed that the dynamic logic circuit should not begin evaluation until its output latch is free. Furthermore, the dynamic logic circuit also requires its inputs to be held stable until its evaluation is complete. The result of this is that a dynamic logic circuit constrains both its input latches and output latches when it is performing an evaluation.

FIG. 1 of the accompanying drawings illustrates a pipeline stage 2 incorporating a dynamic logic circuit 4. A latch circuit 6 latches the output data signals from the dynamic logic circuit 4 such that they are not lost through inherent charge leakage and then passes these output data signals onto the next pipeline stage. A pipeline stage control circuit 8 coordinates the operation of the dynamic logic circuit 4 and the latch circuit 6 with the neighboring pipeline stages.

FIGS. 2 and 3 of the accompanying drawings illustrate a pipeline composed of a number of the pipeline stages of FIG. 1 in operation. Considering FIG. 2, the dynamic logic circuits marked with a tick are active and in the process of evaluating output data signals from input data signals. The latch circuits marked with a tick are latching valid signals that are being evaluated by the following dynamic logic circuit. The latch circuits marked with a cross are waiting to receive the output data signals from their associated dynamic logic circuit.

Considering the pipeline stage 10, its active state is placing a constraint upon the latch circuits 12 and 14. Latch circuit 12 must maintain the inputs to the pipeline stage 10 and so latch circuit 12 is unavailable for its own dynamic logic circuit 16 which must therefore remain idle. The latch circuit 14 must be ready to receive the output data signals from the pipeline stage 10 and so is unavailable for maintaining the input data signals to the dynamic logic circuit 18. Accordingly, the dynamic logic circuit 18 must also remain idle.

FIG. 3 illustrates the situation that occurs when the pipeline stage 10 has completed its evaluation. The constraints upon the latch circuits 12 and 14 are now removed and providing the other conditions are met, then these two neighboring pipeline stages can then operate to evaluate signal values using their respective dynamic logic circuits 16 and 18. The analysis of the pipeline stage 10 can be extended by induction to all the pipeline stages. In this way, it will be seen that such systems are operating with, at best, half of the dynamic logic circuits being active at any one time.

SUMMARY OF THE INVENTION

Viewed from one aspect, the present invention provides apparatus for processing data, said apparatus having a self-timed pipeline formed of a plurality of pipeline stages, at least one of said pipeline stages comprising:

a dynamic logic circuit for evaluating a plurality of input data signals to generate a plurality of output data signals;

a latch circuit for latching said plurality of output data signals; and a pipeline stage control circuit for controlling said dynamic logic circuit and said latch circuit, wherein said pipeline stage control circuit initiates evaluation of said plurality of input data signals upon receipt of both of:

(i) a signal indicating said plurality of input data signals are available; and (ii) a signal indicating a plurality of output data signals evaluated in a previous cycle and currently latched within said latch circuit are being read by a downstream circuit that will complete said reading in time for said plurality of output data signals currently being evaluated by said dynamic logic circuit to be latched by said latch circuit before said plurality of output data signals currently being evaluated become invalid due to inherent charge leakage within said dynamic logic circuit.

The present invention recognizes and exploits that the system described in relation to FIGS. 2 and 3 is over-constrained. It is not strictly necessary that the output latch is free before evaluation begin within its associated dynamic logic circuit. Rather, it is only necessary to know that the output latch will become free in time to latch the output data signals before they are lost. This relaxation of the condition for starting evaluation within the dynamic logic circuits allows a significant improvement in the pipeline's overall processing performance.

It will be appreciated that the downstream circuit could take many different forms, however, when the pipeline stage is embedded within a long pipeline, then the downstream circuit is a downstream pipeline stage.

In an analogous manner, the signal indicating said plurality of input data signals are available is generated by an upstream pipeline stage when a long pipeline is being used.

The pipeline stage control circuits within a multistage pipeline need to communicate with one another. A preferred balance between circuit area consumed and the capacity and sophistication of this communication is achieved in embodiments in which said pipeline stage control circuit has an input request signal line, an input acknowledge signal line, an output request signal line and an output acknowledge signal line.

The pipeline stage control circuit may be responsive to the static signal levels that it detects. However, in preferred embodiments of the invention said pipeline stage control circuit is responsive to the edge transitions upon said input request signal line, said input acknowledge signal line, said output request signal line and said output acknowledge signal line.

Responding to edge transitions rather than static signal levels increases the number of timed events that can be controlled with the two signal lines.

The edge transitions that are available on the signal lines may be allocated meanings by the pipeline control circuits in many different ways. However, in preferred embodiments of the invention a first edge transition upon said input request signal line indicates that said plurality of input data signals are available, a second edge transition upon said output acknowledge signal line indicates that said plurality of output data signals currently latched within said latch circuit are being read by a downstream circuit, and a third edge transition upon said output acknowledge signal line indicates that said downstream circuit has finished reading said plurality of output data signals currently latched within said latch circuit such that said latch circuit is now ready to latch said new plurality of output data signals.

The second edge transition may also be made to indicate that:

(i) said plurality of input data signals are available; and
(ii) a signal indicating said plurality of output data signals currently latched within said latch circuit are being read by a downstream circuit that will complete said reading in time for said plurality of output data signals being evaluated by said dynamic logic circuit to be latched by said latch circuit before said before plurality of output data signals become invalid due to inherent charge leakage within said dynamic logic circuit.

The latch circuit may be formed and controlled in many different ways. However, in preferred embodiments said latch circuit is edge triggered by a clock signal from said pipeline stage controller such that said latch circuit changes said plurality of output data signals latched upon an edge transition in said clock signal.

Having the latch circuit edge triggered enables a closer timed control to be made of the latch circuit so avoiding problems such as allowing transient signal values to propagate through the latch.

The self-timed pipelines with which the present invention is concerned may be used in many different sorts of digital circuit. However, such self-time pipelines are particularly useful as part of a central processing unit where there small size, low power consumption and rapid operation are highly advantageous.

The apparatus of the present invention could be formed of discrete components, however, it is strongly preferred that the apparatus has the form of an integrated circuit since in this way the maximum benefit of a reduced size and power consumption may be achieved.

Viewed from another aspect, the present invention provides a method of processing data, said method using a self-timed pipeline formed of a plurality of pipeline stages, with at least one of said pipeline stages performing the steps of:

evaluating a plurality of input data signals with a dynamic logic circuit to generate a plurality of output data signals;

latching said plurality of output data signals with a latch circuit; and controlling said dynamic logic circuit and said latch circuit with a pipeline stage control circuit, wherein evaluation of said plurality of input data signals is initiated by said pipeline stage control circuit upon receipt of both of:

(i) a signal indicating said plurality of input data signals are available; and
(ii) a signal indicating a plurality of output data signals evaluated in a previous cycle and currently latched within said latch circuit are being read by a downstream circuit that will complete said reading in time for said plurality of output data signals currently being evaluated by said dynamic logic circuit to be latched by said latch circuit before said plurality of output data signals currently being evaluated become invalid due to inherent charge leakage within said dynamic logic circuit.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 4:
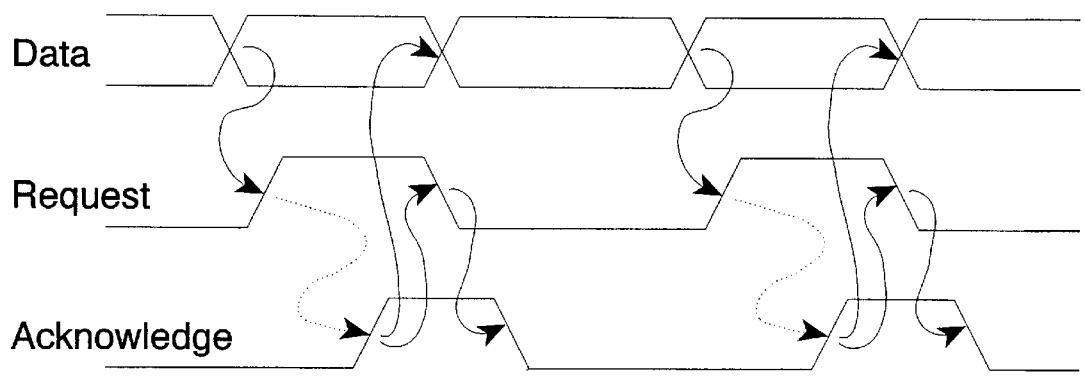
FIG. 4 illustrates a handshaking protocol between pipeline control circuits.

FIG. 4 illustrates a four-phase handshake protocol that may be termed the "early" protocol. This uses the rising edge of the request line to indicate "data available" and the rising edge of the acknowledge line to indicate "data latched". The falling edges carry no meaning. The dotted line between the rising edge of the request line and the rising edge of the acknowledge line is the time period during which the dynamic logic circuit 4 must evaluate the data input signals applied to it.

An alternative protocol would be a "late" protocol that used the falling edges of both the request and acknowledge lines.

Figure 5:
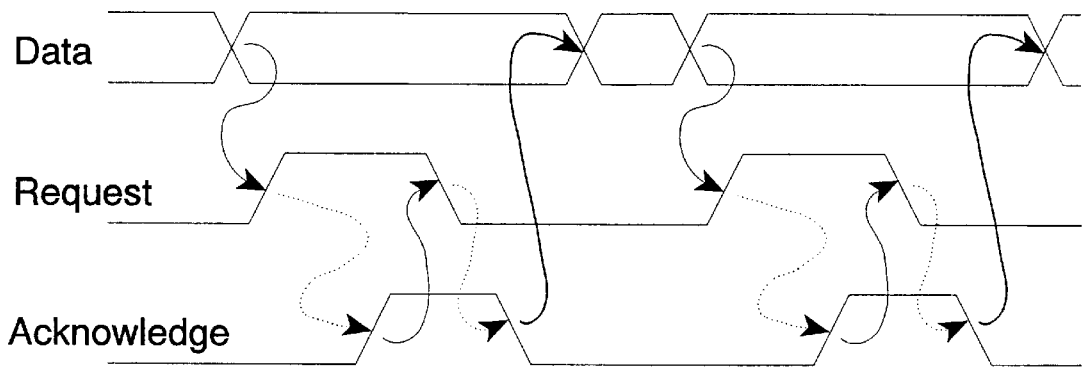
FIG. 5 illustrates an alternative handshaking protocol between pipeline control circuits.

A further four-phase handshake protocol is illustrated in FIG. 5. This protocol may be termed the "broad" protocol and uses the rising edge of the request line and the falling edge of the acknowledge line. This protocol allows the unused rising edge of the acknowledge line to be utilised to indicate that evaluation may be commenced by the dynamic logic circuit. This rising edge of the acknowledge line falls between the data available indication and the data latched indication as is required.

The information passed by the rising edge of the acknowledge line could also be passed by the utilization of an additional line between the pipeline stage control circuits, but this would result in an undesirable increase in the number of wires needed.

The above protocols for handshaking all take the point of view that the sender of data initiates the transfer; where the receiver may be the initiator, further protocols are possible.

Figure 1:
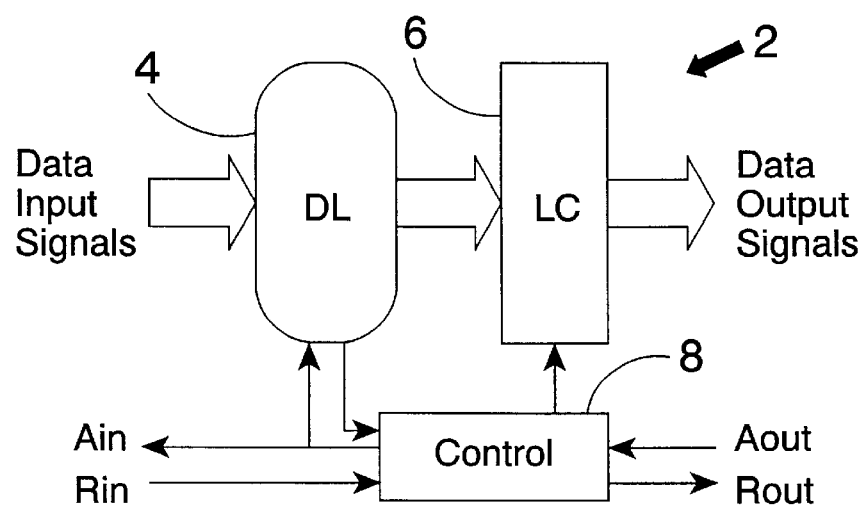
FIG. 1 illustrates a pipeline stage utilizing a dynamic logic circuit.

Returning to FIG. 1, the operation of this circuit using the handshake protocol illustrated in FIG. 5 is as follows. The dynamic logic circuit 4 and the latch circuit 6 are controlled using the input request signal line Rin, the input acknowledge signal line Ain, the output request signal line Rout and the output acknowledge signal line Aout.

The dynamic logic circuit 4 begins evaluation when its enable signal E (corresponding to Ain) goes high. The dynamic logic 4 indicates that it has produced a valid output by asserting a done signal D to the pipeline stage control circuit 8. The dynamic logic circuit 4 is precharged when the enable signal E is low and precharge completion is signalled by the dynamic logic circuit 4 by the done signal D going low.

The latch circuit 6 which receives the output data signals evaluated by the dynamic logic circuit 4 may be a transparent latch which passes data when a latch enable signal Lt generated by the pipeline stage control circuit 8 is low and holds its values when the latch enable signal Lt is high. Alternatively, the latch circuit 6 may be a positive-edge triggered flip-flop. The multi stage pipelines illustrated in FIGS. 2 and 3 assume that each pipeline stage is connected to similar neighbors. At the ends of the pipeline, the pipeline stages may be interfaced to different circuits.

Figure 2:
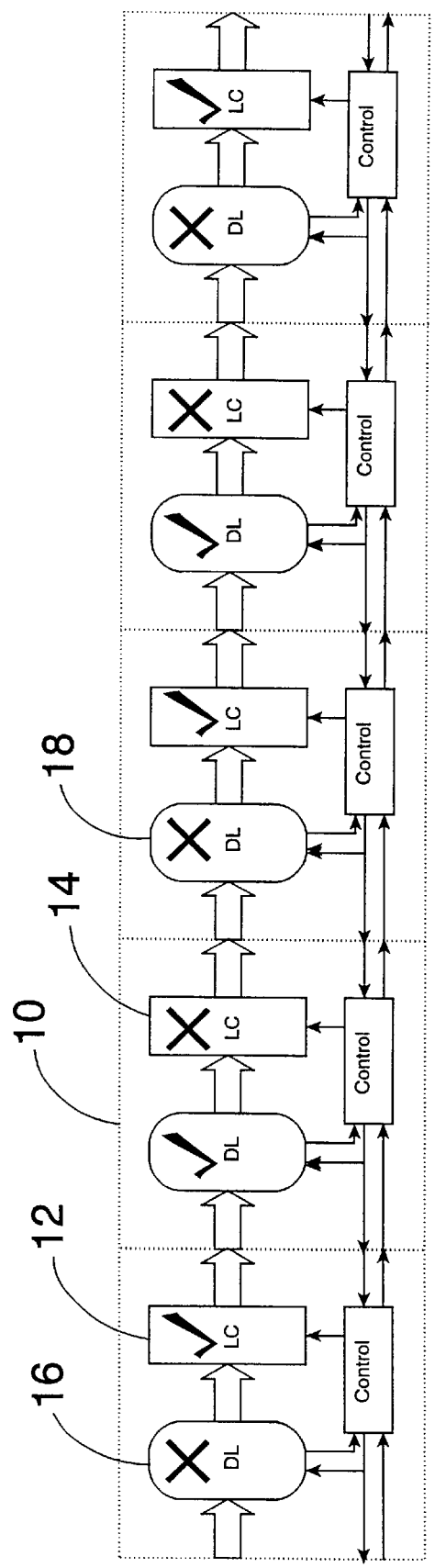
FIG. 2 illustrates the operation of a pipeline composed of pipeline stages as illustrated in FIG. 1.
Figure 3:
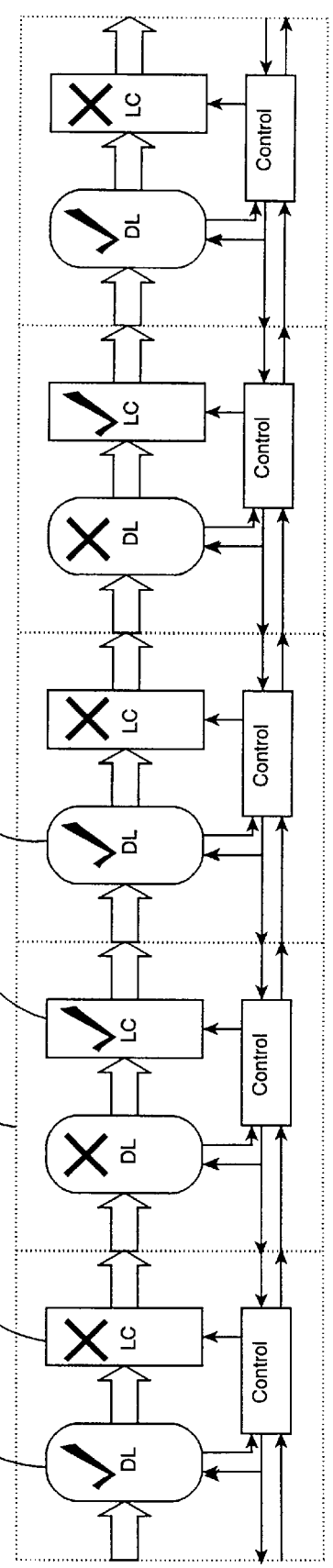
FIG. 3 illustrates the pipeline of FIG. 2 at a later point in time.
Figure 6:
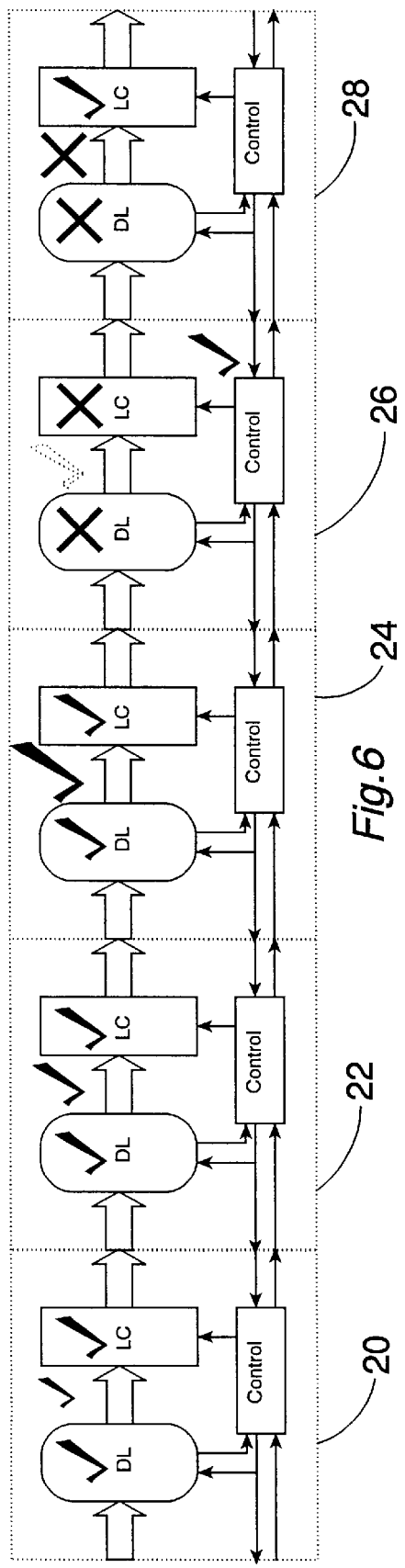
FIG. 6 illustrates the operation of a pipeline as illustrated in FIGS. 2 and 3 with modified constraints.

FIG. 6 illustrates the operation of a multi-stage pipeline in which the constraints have been relaxed over those of FIGS. 2 and 3. A tick in a latch circuit of a stage indicates that it is latching signal values. A cross in a latch circuit indicates that it is not currently latching any signal values but is in the process of reading its inputs so as to have these as the new latched values.

A tick in a dynamic logic circuit indicates that it is currently active and is evaluating signal values. The output data signals passed between the dynamic logic circuit 4 and the latch circuit 6 of each stage may be considered to have various states. In stage 20, the dynamic logic circuit 4 has just started its evaluation and the output data signals are building to their valid signal levels. This is indicated by a small tick. Evaluation has reached a later phase in stage 22, which is indicated by a larger tick and is finally completed in stage 24 which is indicated by a still larger tick. It will be appreciated that the different pipeline stage 20 22 and 24 are all operating on different sets of input data signals to generate different sets of output data signals.

In stage 26, the dynamic logic circuit has completed its evaluation and the output data signals are valid but are slowly decaying through inherent charge leakage within the pipeline stage. This is indicated by a dashed tick. The latch circuit has not yet read and latched the output data signals but is just in the process of doing this as is illustrated by the tick on the latch enable signal Lt.

Pipeline stage 28 does not have reliable input data signals applied to it (indicated by a cross) since the latch circuit of the preceding stage is just storing new values within itself. Accordingly, the dynamic logic circuit of pipeline stage 28 is idle. The latch circuit of pipeline stage 28 is latching the output data signal values previously generated by the dynamic logic circuit of stage 28.

Figure 7:
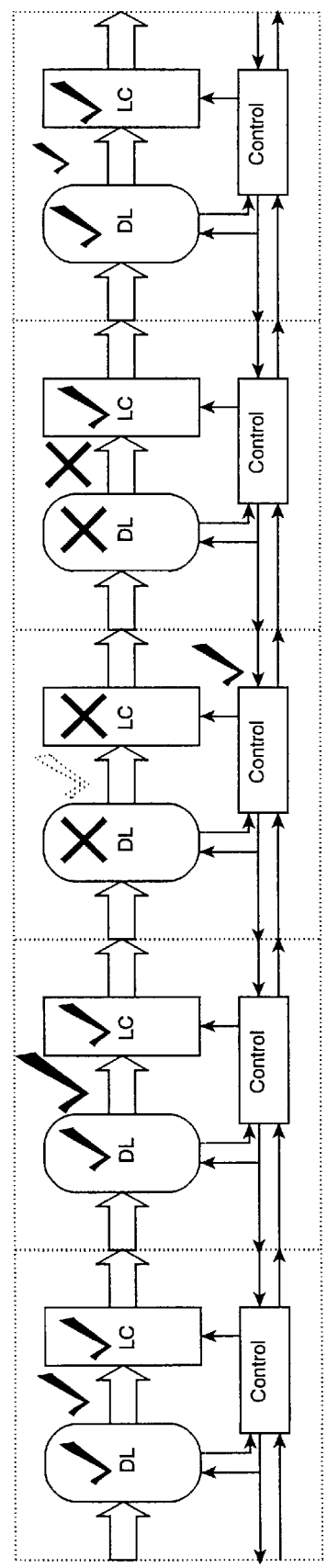
FIG. 7 illustrates the pipeline of FIG. 6 at a later point in time.

FIG. 7 illustrates the pipeline of FIG. 6 at a slightly later point in time. The phase of each of the pipeline stages has advanced. This process continues with each individual pipeline stage advancing through the building up of valid output data signals, the holding of these subject to gradual charge leakage and then the latching of these before they have diminished too far.

In the example shown in FIGS. 6 and 7, three pipeline stages are shown as active, whilst two are shown as idle. In practice, the ratio of active stages to idle stages may be increased further.

Figure 8:
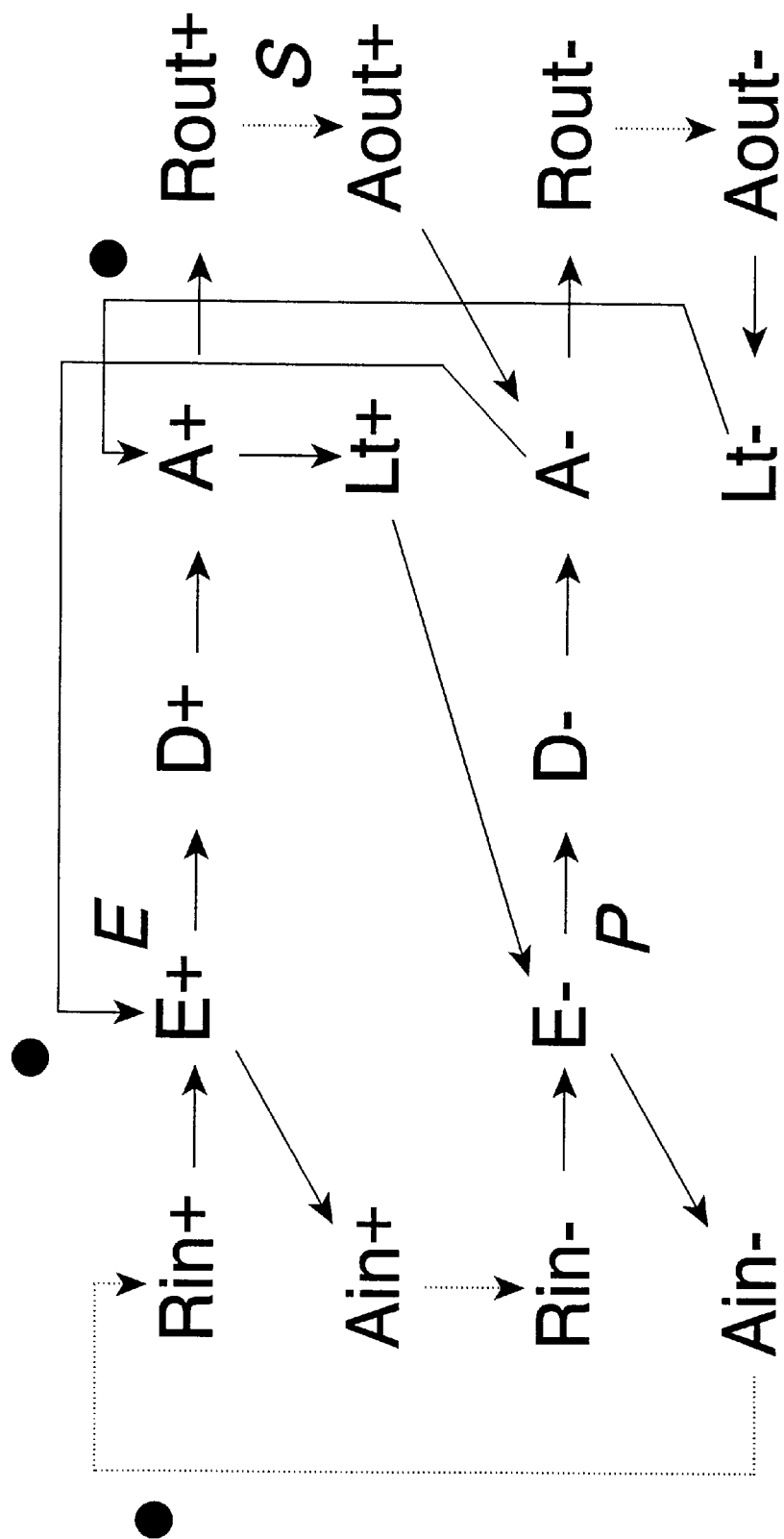
FIG. 8 illustrates a signal transition graph for one embodiment of a pipeline control circuit.

FIG. 8 illustrates a signal transition graph for a pipeline stage control circuit that may be used to control a transparent latch. Signal transition graphs are discussed in T.-A. Chu, "Synthesis of Self-Timed VLSI Circuits from Graph-Theoretic Specifications", in Proceedings of ICCD'87, IEEE, pp. 220–223, October 1987.

The notation used has a "+" indicating a rising edge transition and a "−" indicating a falling edge transition. Solid arrows indicate causal dependencies between transitions which the control circuit must enforce. The dashed arrows indicate causal dependencies that external circuits must obey. The black dots are initial markings. A transition may fire only when there is a marker on each of its inputs. When a transition has fired, those markers on its inputs are removed and markers are placed on each of its outputs, possibly enabling further transitions. When more than one transition is enabled, they may fire in any order. The signal transition graph of FIG. 8 incorporates a state variable A, which is used to achieve the required operation. In this embodiment, the output data signals are latched (Lt+) when the dynamic logic circuit has completed its evaluation (D+) and are held until the next stage has finished using them (Aout−). Evaluation begins (E+) when the input data is ready (Rin+) and the previous result has entered processing in the next stage (Aout+). This condition is sufficient in that the output latch circuit will become free "soon", i.e. before the output data signals have decayed through inherent charge leakage.

It is important that "soon" should be a period which is not subject to arbitrary external delay, i.e. is the result of internal self-timed delays only. If the next stage is similar to the current one, it can only stall between Rout+ and Aout+ on the arrow marked S. If this is true, this property is propagated back to the input, and hence, by mathematical induction along a pipeline of similar stages. Care is needed at the end conditions to ensure that these requirements are also met.

The evaluate phase (E) and the precharge phase (P), together with a few internal control delays, determine the cycle time of this stage and the throughput of the pipeline.

If the pipeline stage control circuit 8 operates in accordance with FIG. 8 to control a transparent latch, then the latch circuit 6 will be normally open, allowing transients to propagate down the pipeline and so wasting power. In order to avoid this undesirable phenomenon, edge-triggered latches may be used to ensure that only valid data values are propagated.

Normally, an edge triggered latch should have a static behavior when its clock is either held high or low. However, fully meeting this requirement results in a circuit that is rather complex when a full set of weak feedback components is added. Instead, a particularly simple form of dynamic single-phase clock edge-triggered latch as illustrated in FIG. 9 may be used if the pipeline stage control circuit 8 is designed such that the clock is never held high and weak feedback is required only when the clock is held low.

Figure 9:
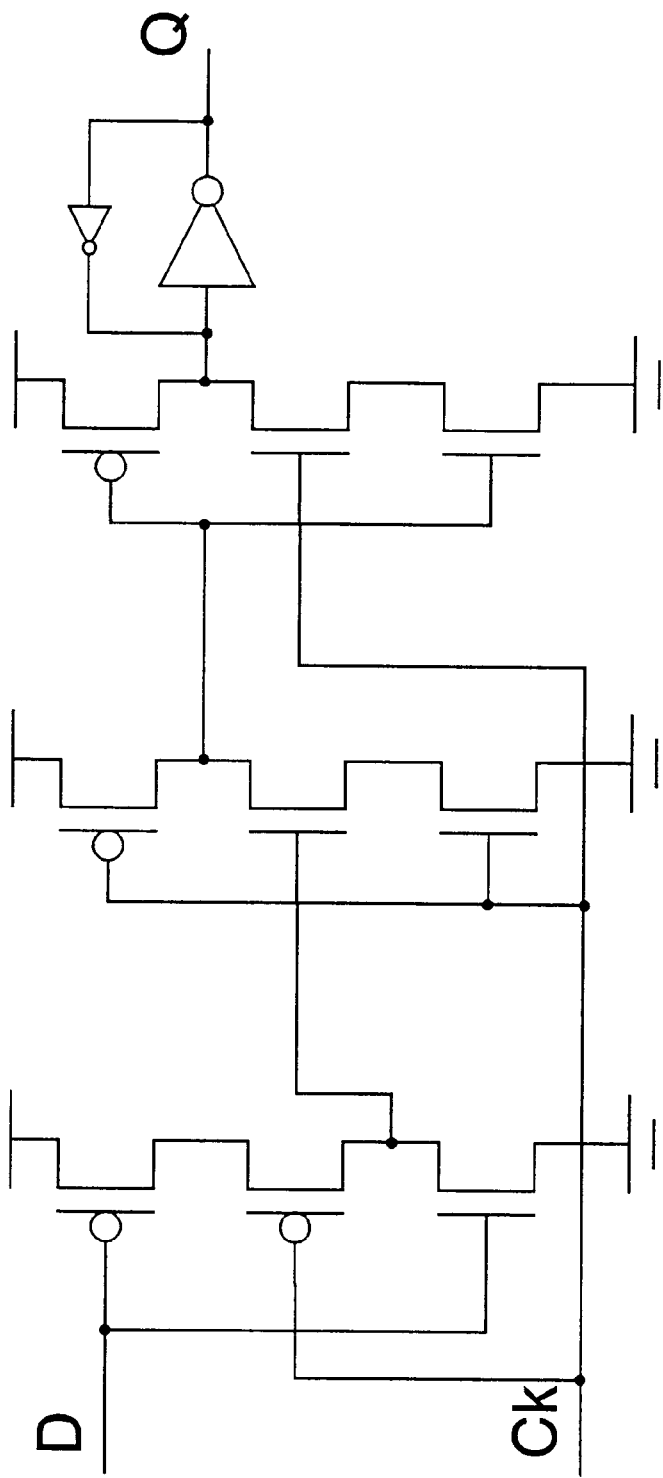
FIG. 9 illustrates an edge-triggered latch circuit.
Figure 10:
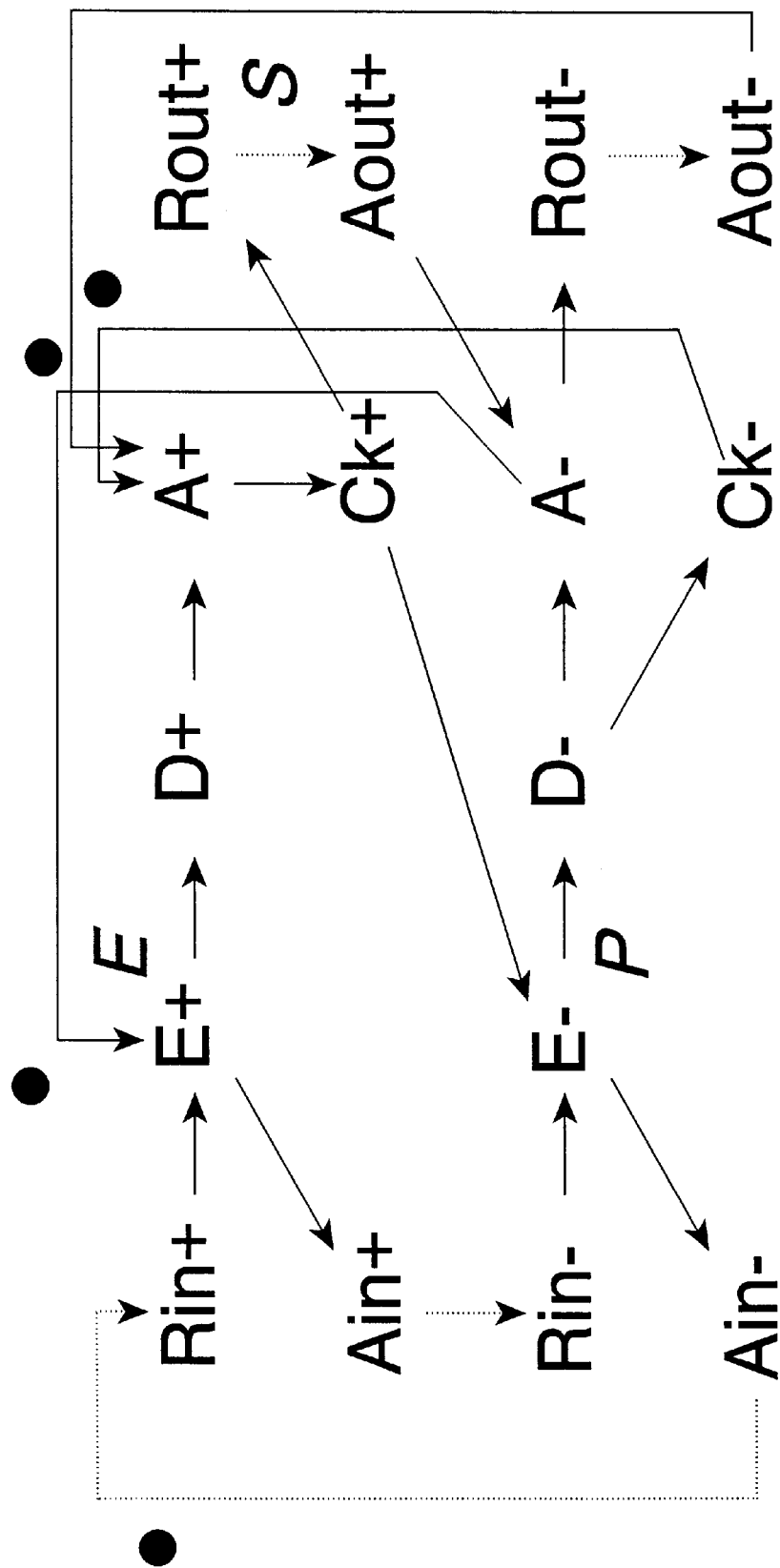
FIG. 10 illustrates a signal transition graph for a pipeline control circuit for controlling the edge triggered latch of FIG. 9.

FIG. 10 illustrates a signal transition graph for controlling the edge-triggered latch circuit of FIG. 9. The notation used in FIG. 10 is the same as for FIG. 8. The signal transition graphs shown in FIGS. 8 and 9 may be used to derive a state graph by following the underlying Petri Net rules (J Petersen, Petri Net Theory and Modelling of Systems, Prentice Hall, 1981) and then an implementation derived from the state graph in accordance with usual techniques. This derivation may be automated using tools such as FORCAGE (M Kishinevsky, A Kondratyev, A Taubin and V Varshavsky, Concurrent Hardware—The Theory and Practice of Self-Timed Circuits, Wiley Series in Parallel Computing, 1994). In this case, the implementation is expressed in the form of logic equations which may be converted into R-S flip-flops or Muller C-Gates.

Figure 11:
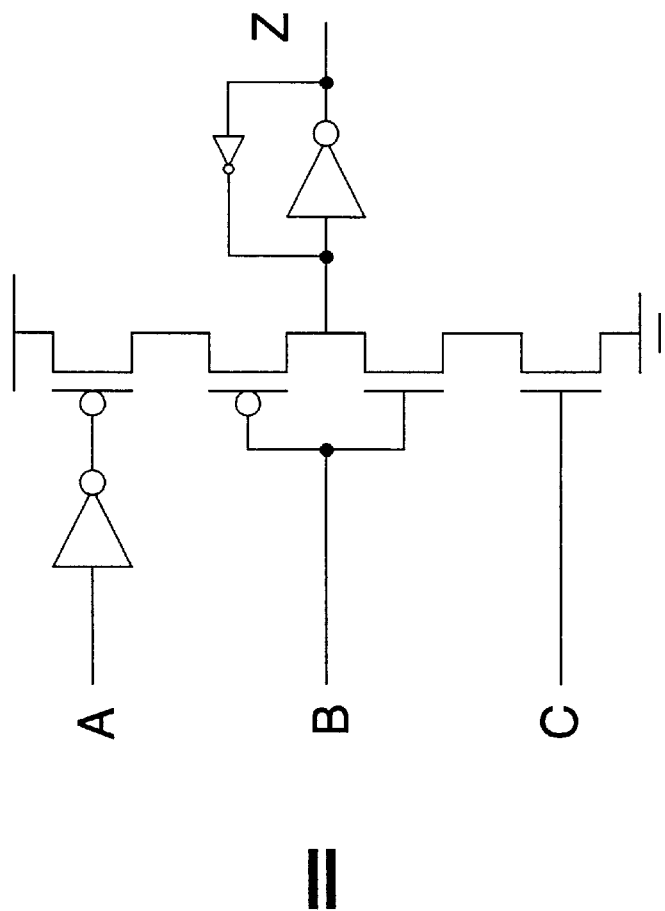
FIG. 11 illustrates a notation used for an asymmetric C-gate.
Figure 11:
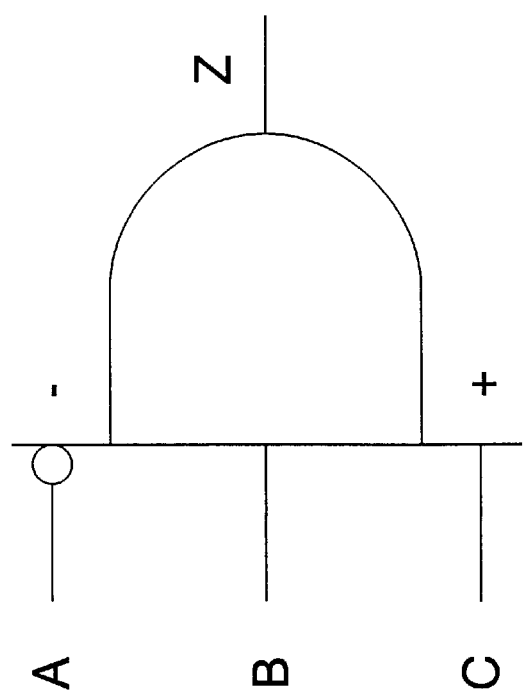

FIG. 11 illustrates how the notation used for Muller C-Gates relates to FET circuit elements. The notation used in FIGS. 12 and 13 for asymmetric C-Gates indicates that an input controls both edges of the output when it is connected to the main body of the gate. An input controls only the rising edge of the output when connected to the extension marked "+". An input controls only the falling edge of the output when it is connected to the extension marked "−".

Figure 12:
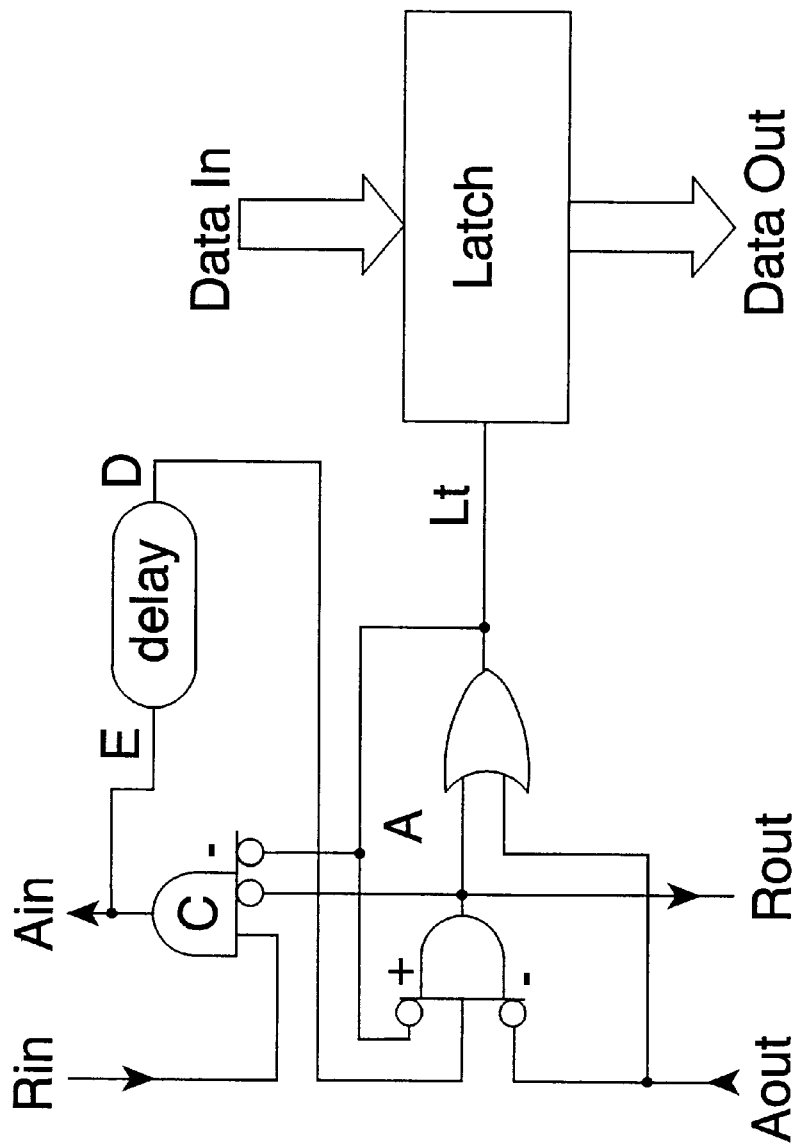
FIG. 12 illustrates a pipeline stage control circuit for operating with a transparent latch.

FIG. 12 illustrates the implementation of a pipeline stage control circuit 8 for controlling a transparent latch 6. The dynamic logic circuit 4 is illustrated as receiving an enable input E and generate a done input D.

Figure 13:
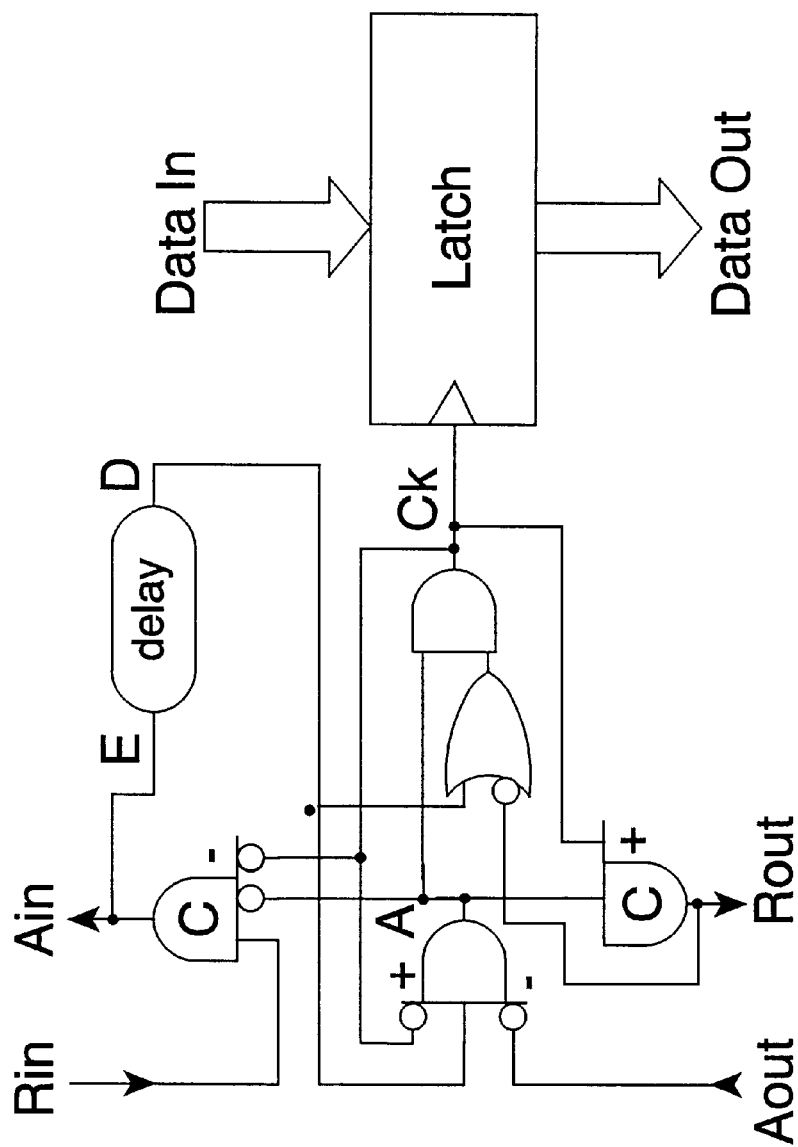
FIG. 13 illustrates a pipeline stage control circuit for operating with an edge-triggered latch.

FIG. 13 illustrates a pipeline stage control circuit for controlling the edge-triggered latch circuit of FIG. 9.

Although the broad handshake protocol may be used throughout the design, there are occasions when it may be desirable to interface to alternative protocols, such as the early protocol, semi-decoupled, fully-decoupled and long-hold latch controllers.

To interface from an early protocol into a dynamic pipeline as discussed above, it is necessary only to hold the input data valid until the output acknowledge falls (that is to use the broad protocol on the output side). A long-hold latch controller would have the required characteristics.

To interface a dynamic pipeline into an early protocol latch would appear to be straightforward, since the broader protocol is more than sufficient to cover the input specification of an early protocol latch. However, the dynamic pipeline is not simply using the broad protocol, it is also signalling additional information. In particular, the output device must never stall between Aout+ and Aout−. This condition is satisfied by a fully-decoupled controller but not a semi-decoupled controller.

In summary, the above described embodiments allow dynamic logic circuits within a pipeline to be supported in an asynchronous framework without recourse to charge retention circuits and without unduly restricting the system performance by overly strict constraints. This is achieved by allowing the dynamic logic circuits to begin evaluation when it is known that the output latch will shortly become available. This information is propagated back up the pipeline using a previously redundant transition in the broad four-phase protocol to signal "nearly ready".

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for processing data, said apparatus having a self-timed pipeline formed of a plurality of pipeline stages, at least one of said pipeline stages comprising:
   (i) a dynamic logic circuit for evaluating a plurality of input data signals to generate a plurality of output data signals;
   (ii) a latch circuit for latching said plurality of output data signals; and
   (iii) a pipeline stage control circuit for controlling said dynamic logic circuit and said latch circuit, wherein
   (iv) said pipeline stage control circuit initiates evaluation of said plurality of input data signals upon receipt of both of:
      (a) a signal indicating said plurality of input data signals are available; and
      (b) a signal indicating a plurality of output data signals evaluated in a previous cycle and currently latched within said latch circuit are being read by a downstream circuit that will complete said reading in time for said plurality of output data signals currently being evaluated by said dynamic logic circuit to be latched by said latch circuit before said plurality of output data signals currently being evaluated become invalid due to inherent charge leakage within said dynamic logic circuit.

2. Apparatus as claimed in claim 1, wherein said downstream circuit is a downstream pipeline stage.

3. Apparatus as claimed in claim 1, wherein said signal indicating said plurality of input data signals are available is generated by an upstream pipeline stage.

4. Apparatus as claimed in claim 1, wherein said pipeline stage control circuit has an input request signal line, an input acknowledge signal line, an output request signal line and an output acknowledge signal line.

5. Apparatus as claimed in claim 4, wherein said pipeline stage control circuit is responsive to the edge transitions upon said input request signal line, said input acknowledge signal line, said output request signal line and said output acknowledge signal line.

6. Apparatus as claimed in claim 5, wherein a first edge transition upon said input request signal line indicates that said plurality of input data signals are available, a second edge transition upon said output acknowledge signal line indicates that said plurality of output data signals currently latched within said latch circuit are being read by a downstream circuit, and a third edge transition upon said output acknowledge signal line indicates that said downstream circuit has finished reading said plurality of output data signals currently latched within said latch circuit such that said latch circuit is now ready to latch said new plurality of output data signals.

7. Apparatus as claimed in claim 6, wherein said second edge transition indicates (a) that said plurality of input data signals are available; and (b) a signal indicating said plurality of output data signals currently latched within said latch circuit are being read by a downstream circuit that will complete said reading in time for said plurality of output data signals being evaluated by said dynamic logic circuit to be latched by said latch circuit before said before plurality of output data signals become invalid due to inherent charge leakage within said dynamic logic circuit.

8. Apparatus as claimed in claim 1, wherein said latch circuit is edge triggered by a clock signal from said pipeline stage controller such that said latch circuit changes said plurality of output data signals latched upon an edge transition in said clock signal.

9. Apparatus as claimed in claim 1, wherein said self-timed pipeline is part of a central processing unit.

10. Apparatus as claimed in claim 1, wherein said apparatus is an integrated circuit.

11. A method of processing data, said method using a self-timed pipeline formed of a plurality of pipeline stages, with at least one of said pipeline stages performing the steps of:

(i) evaluating a plurality of input data signals with a dynamic logic circuit to generate a plurality of output data signals;

(ii) latching said plurality of output data signals with a latch circuit; and (iii) controlling said dynamic logic circuit and said latch circuit with a pipeline stage control circuit, wherein (iv) evaluation of said plurality of input data signals is initiated by said pipeline stage control circuit upon receipt of both of:

(a) a signal indicating said plurality of input data signals are available; and (b) a signal indicating a plurality of output data signals evaluated in a previous cycle and currently latched within said latch circuit are being read by a downstream circuit that will complete said reading in time for said plurality of output data signals currently being evaluated by said dynamic logic circuit to be latched by said latch circuit before said plurality of output data signals currently being evaluated become invalid due to inherent charge leakage within said dynamic logic circuit.

\* \* \* \* \*